United States Patent
Liu et al.

(10) Patent No.: US 11,194,238 B2
(45) Date of Patent: Dec. 7, 2021

(54) HEAT DISSIPATION MODULE AND PROJECTION APPARATUS

(71) Applicant: Coretronic Corporation, Hsin-Chu (TW)

(72) Inventors: Wei-Chi Liu, Hsin-Chu (TW); Tsung-Ching Lin, Hsin-Chu (TW); Shi-Wen Lin, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 26 days.

(21) Appl. No.: 16/831,813

(22) Filed: Mar. 27, 2020

(65) Prior Publication Data
US 2020/0310234 A1 Oct. 1, 2020

(30) Foreign Application Priority Data
Mar. 29, 2019 (CN) .......................... 201910247857.6

(51) Int. Cl.
*G03B 21/16* (2006.01)
*H05K 7/20* (2006.01)
(52) U.S. Cl.
CPC ......... *G03B 21/16* (2013.01); *H05K 7/20145* (2013.01); *H05K 7/20272* (2013.01)
(58) Field of Classification Search
CPC .............. G03B 21/16; G03B 21/00–64; H04N 9/3144; H04N 9/31–3197; H05K 7/00–2099
See application file for complete search history.

(56) References Cited

U.S. PATENT DOCUMENTS

| 5,309,319 A | 5/1994 | Messina |
| 7,757,752 B2 | 7/2010 | Egawa et al. |

(Continued)

FOREIGN PATENT DOCUMENTS

| CN | 2497514 | 6/2002 |
| CN | 200997750 | 12/2007 |

(Continued)

OTHER PUBLICATIONS

"Office Action of China Counterpart Application", dated May 7, 2021, p. 1-p. 8.

(Continued)

*Primary Examiner* — Michelle M Iacoletti
*Assistant Examiner* — Christopher A Lamb, II
(74) *Attorney, Agent, or Firm* — JCIPRNET

(57) ABSTRACT

A heat dissipation module includes a housing, at least one inlet, at least one outlet and at least one heat dissipation set. The housing includes a partition dividing the housing, such that a first accommodation space and a second accommodation space are formed inside the housing. At least one opening is disposed in the partition, penetrates through the partition and communicates the first accommodation space with the second accommodation space. The inlet is connected to the housing and communicates with the first accommodation space. The outlet is connected to the housing and communicates with the second accommodation space. The heat dissipation set is located in the second accommodation space. A projection apparatus is also provided. The heat dissipation module and the projection apparatus may effectively exhaust the heat accumulated on the at least one heat dissipation set, which facilitates reducing a temperature of a heat source with high heat-density.

19 Claims, 12 Drawing Sheets

(56) References Cited

U.S. PATENT DOCUMENTS

| | | | | |
|---|---|---|---|---|
| 2010/0060858 A1* | 3/2010 | Minami | ............... | G03B 21/145 |
| | | | | 353/20 |
| 2016/0301902 A1* | 10/2016 | Nakamura | ................ | F28F 3/02 |
| 2017/0045307 A1* | 2/2017 | Tsai | ...................... | H01L 23/467 |

FOREIGN PATENT DOCUMENTS

| | | |
|---|---|---|
| CN | 201017162 | 2/2008 |
| CN | 202678715 | 1/2013 |
| CN | 202759729 | 2/2013 |
| CN | 103256757 | 8/2013 |
| CN | 203165876 | 8/2013 |
| CN | 203206647 | 9/2013 |
| CN | 204707386 | 10/2015 |
| CN | 204836927 | 12/2015 |
| CN | 106054506 | 10/2016 |
| CN | 208270917 | 12/2018 |
| CN | 208459759 | 2/2019 |
| CN | 209446956 | 9/2019 |

OTHER PUBLICATIONS

"Office Action of China Counterpart Application", dated Sep. 23, 2021, p. 1-p. 9.

* cited by examiner

HEAT DISSIPATION MODULE AND PROJECTION APPARATUS

CROSS-REFERENCE TO RELATED APPLICATION

This application claims the priority benefit of China application serial no. 201910247857.6, filed on Mar. 29, 2019. The entirety of the above-mentioned patent application is hereby incorporated by reference herein and made a part of this specification.

BACKGROUND

Field of the Invention

The invention relates to a heat dissipation module and a projection apparatus including the heat dissipation module.

Description of Related Art

A high-pressure mercury lamp is commonly used as a projection light source in a conventional projection apparatus. With the progress in semiconductor manufacturing processes recently, light-emitting diodes (LEDs) or laser diodes as light sources for semiconductor devices have been developed. Although using semiconductor devices with these light sources may have advantages, such as smaller volumes, higher brightness and so on, the semiconductor devices may suffer from a higher heat-density caused from the smaller volumes. Therefore, these semiconductor devices may need better or more efficiency in heat dissipation. Therefore, how to effectively reduce the temperature of such heat sources with a high heat-density becomes an important issue to be solved for this field.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention were acknowledged by a person of ordinary skill in the art.

SUMMARY

The invention provides a heat dissipation module and a projection apparatus, which may be used to effectively reduce the temperature of a heat source with a high heat-density.

Other features and advantages of the invention may be further understood by the technical features disclosed in the invention.

To achieve one, part, or all of the objectives aforementioned or other objectives, an embodiment of the invention provides a heat dissipation module including a housing, at least one inlet, at least one outlet and at least one heat dissipation set. The housing includes a partition. The partition divides the housing to form a first accommodation space and a second accommodation space inside the housing. At least one opening is disposed in the partition. The at least one opening penetrates through the partition and communicates the first accommodation space with the second accommodation space. The at least one inlet is connected to the housing and communicates with the first accommodation space. The at least one outlet is connected to the housing and communicates with the second accommodation space. At least one heat dissipation set is located in the second accommodation space.

To achieve one, part, or all of the objectives aforementioned or other objectives, an embodiment of the invention provides a projection apparatus including a light source module, a light valve, a projection lens and the heat dissipation module. The light source provides an illumination beam. The light valve converts the illuminating beam into an image beam. The projection lens projects the image light beam. The heat dissipation module includes a housing, at least one inlet, at least one outlet and at least one heat dissipation set. The housing includes a partition, and the partition divides the housing to form a first accommodation space and a second accommodation space inside the housing. At least one opening is disposed in the partition. The at least one opening penetrates through the partition and communicates the first accommodation space with the second accommodation space. The at least one inlet is connected to the housing and communicates with the first accommodation space. The at least one outlet is connected to the housing and communicates with the second accommodation space. At least one heat dissipation set is located in the second accommodation space.

To sum up, in the heat dissipation module and the projection apparatus of the invention, the partition divides the housing to form the first accommodation space and the second accommodation space inside the housing, and the at least one heat dissipation set is located in the second accommodation space. The at least one inlet communicates with the first accommodation space, the at least one opening penetrates through the partition and communicates the first accommodation space with the second accommodation space. The second accommodation space communicates with the at least one outlet. In such a configuration, heat accumulated at the heat dissipation set may be effectively transferred out, and the temperature of the heat source with a high heat-density may be effectively reduced.

Other objectives, features and advantages of the present invention will be further understood from the further technological features disclosed by the embodiments of the present invention wherein there are shown and described preferred embodiments of this invention, simply by way of illustration of modes best suited to carry out the invention.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention may be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
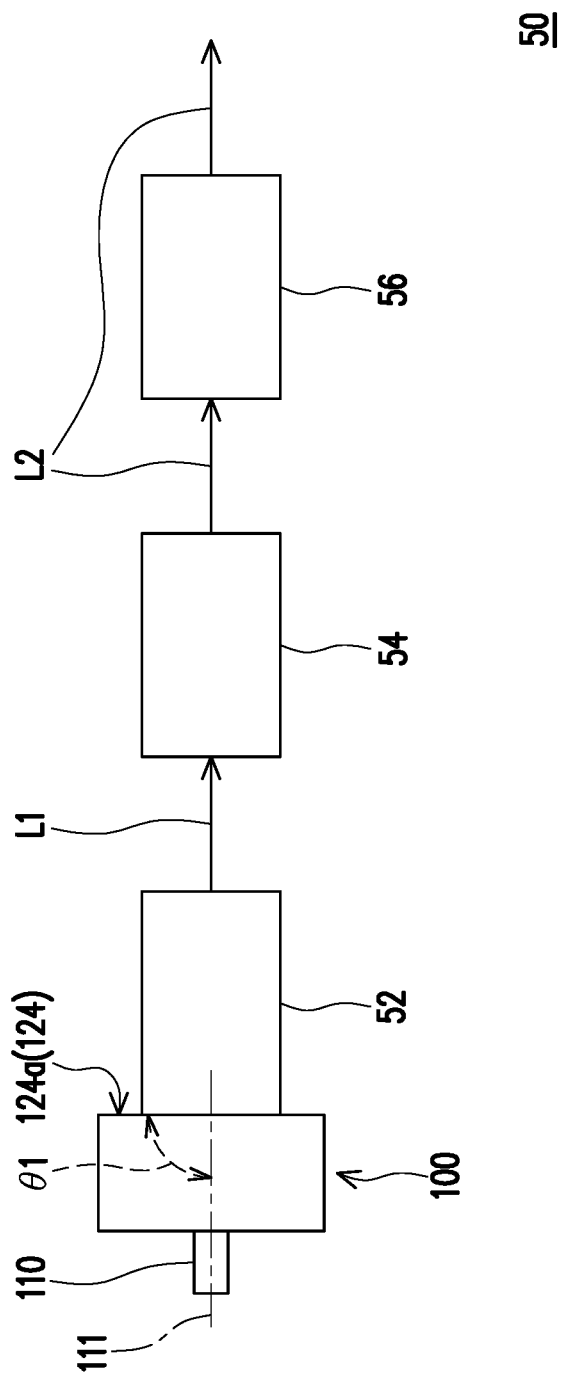
FIG. 1 is a schematic diagram illustrating a projection apparatus according to an embodiment of the invention.

FIG. 1 is a schematic diagram illustrating a projection apparatus according to an embodiment of the invention. With reference to FIG. 1, a projection apparatus 50 of the present embodiment includes a light source module 52, a light valve 54, a projection lens 56 and a heat dissipation module 100. The light source module 52 of the projection apparatus 50 may provide an illumination beam L1. The light valve 54 may convert the illuminating beam L1 provided by the light source module 52 into an image beam L2. The image beam L2 may be finally projected by the projection lens 56 to the outside of the projection apparatus 50.

In an embodiment, the light source module 52 may include, for example, a high brightness-halogen bulb, but the invention is not limited thereto. In other embodiments, the light-source module 52 may include at least one light emitting element (not shown) and the light-source module 52 may be used to provide the illuminating beam L1. For example, the light source module 52 may include a plurality of laser diodes, light emitting diodes (LEDs) or other solid-state illumination sources arranged in an array. The invention is not intended to limit the aspect or the type of the light source module 52.

In an embodiment, the light valve 54 may include a digital micro-mirror device (DMD), which may be used to reflect the image beam L2 to the projection lens 56. In other embodiments, the light valve 54 may include a transmissive spatial light modulator (SLM), such as a transparent liquid crystal panel. The aspect and the type of the light valve 54 are not particularly limited in the invention.

In an embodiment, the projection lens 56 includes a plurality of lenses for enlarging an image to project it to a screen or a wall.

It should be mentioned that FIG. 1 merely exemplarily illustrates a scenario that the heat dissipation module 100 is applied to the projection apparatus 50. The heat dissipation module 100 may be used to dissipate heat from any heat source. Even though FIG. 1 illustrates an embodiment that the heat dissipation module 100 contacts the light source module 52 and dissipates the heat from the light source module 52, in other embodiments not shown, the heat dissipation module 100 may also contact the light valve 54 and dissipate the heat from the light valve 54. The object which the heat dissipation module 100 is applied to is not limited in the present embodiment.

Figure 2A:
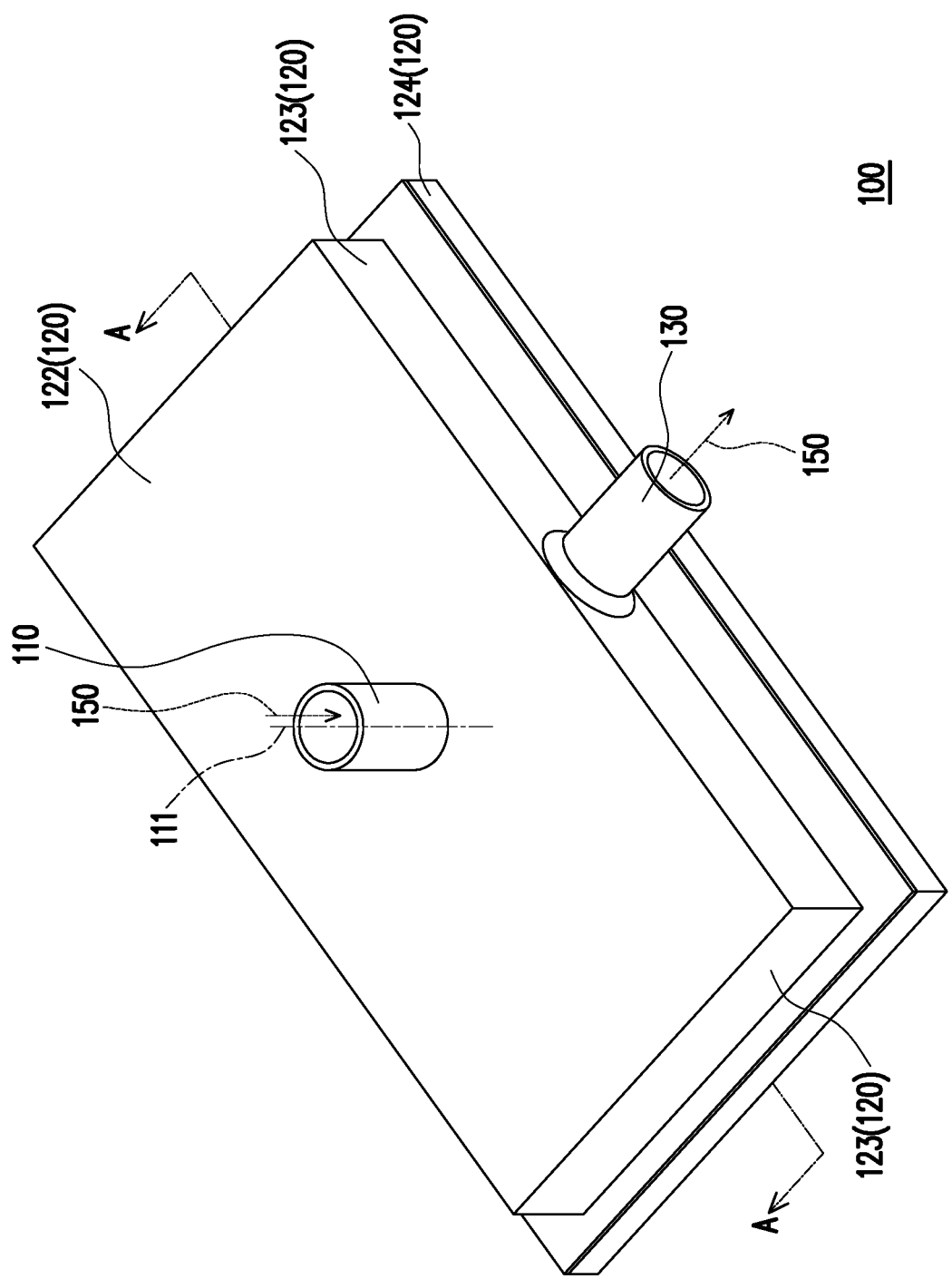
FIG. 2A is a schematic stereoscopic diagram illustrating a heat dissipation module according to an embodiment of the invention.
Figure 2B:
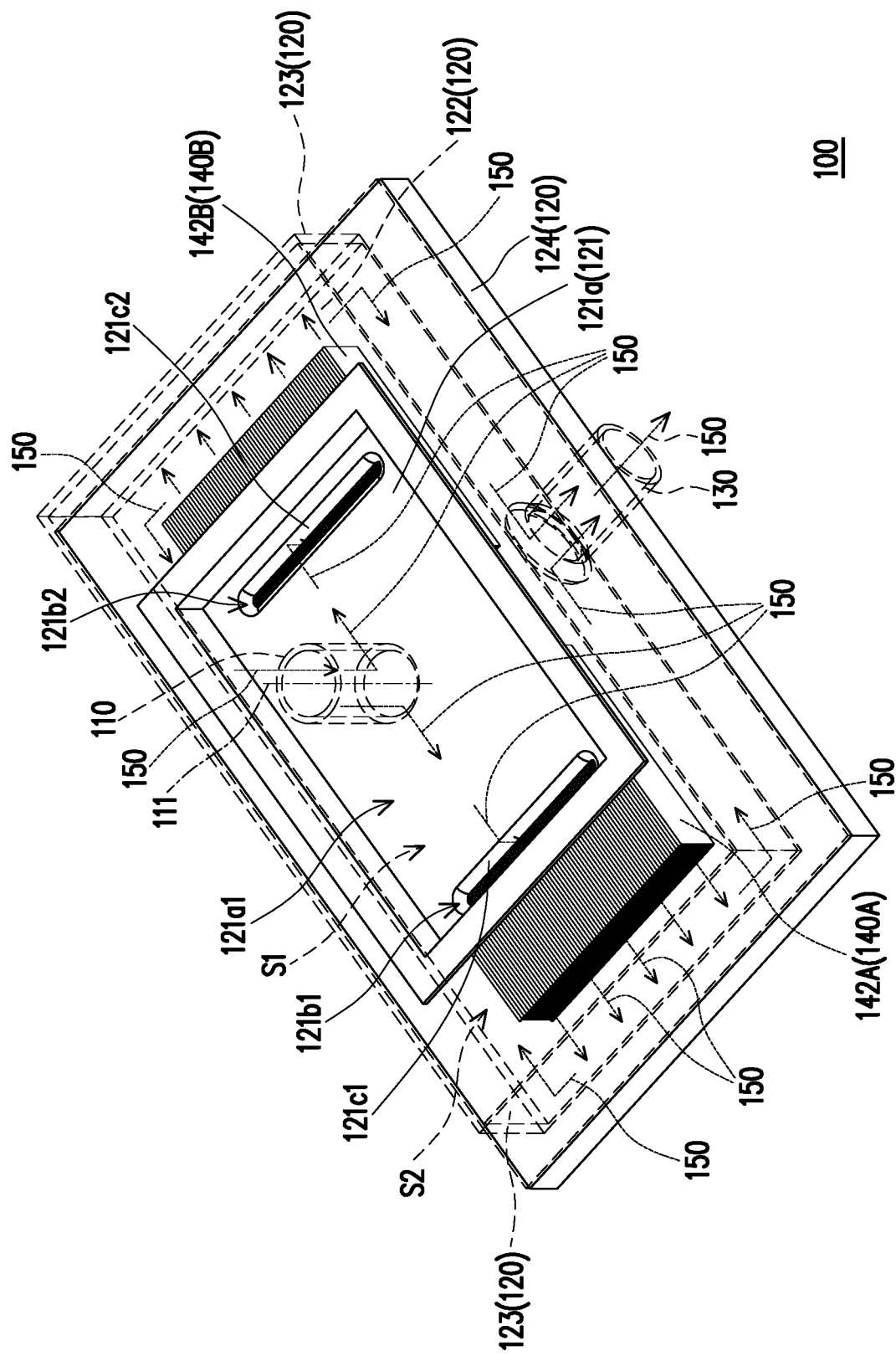
FIG. 2B is a schematic perspective diagram illustrating the heat dissipation module depicted in FIG. 2A.
Figure 2C:
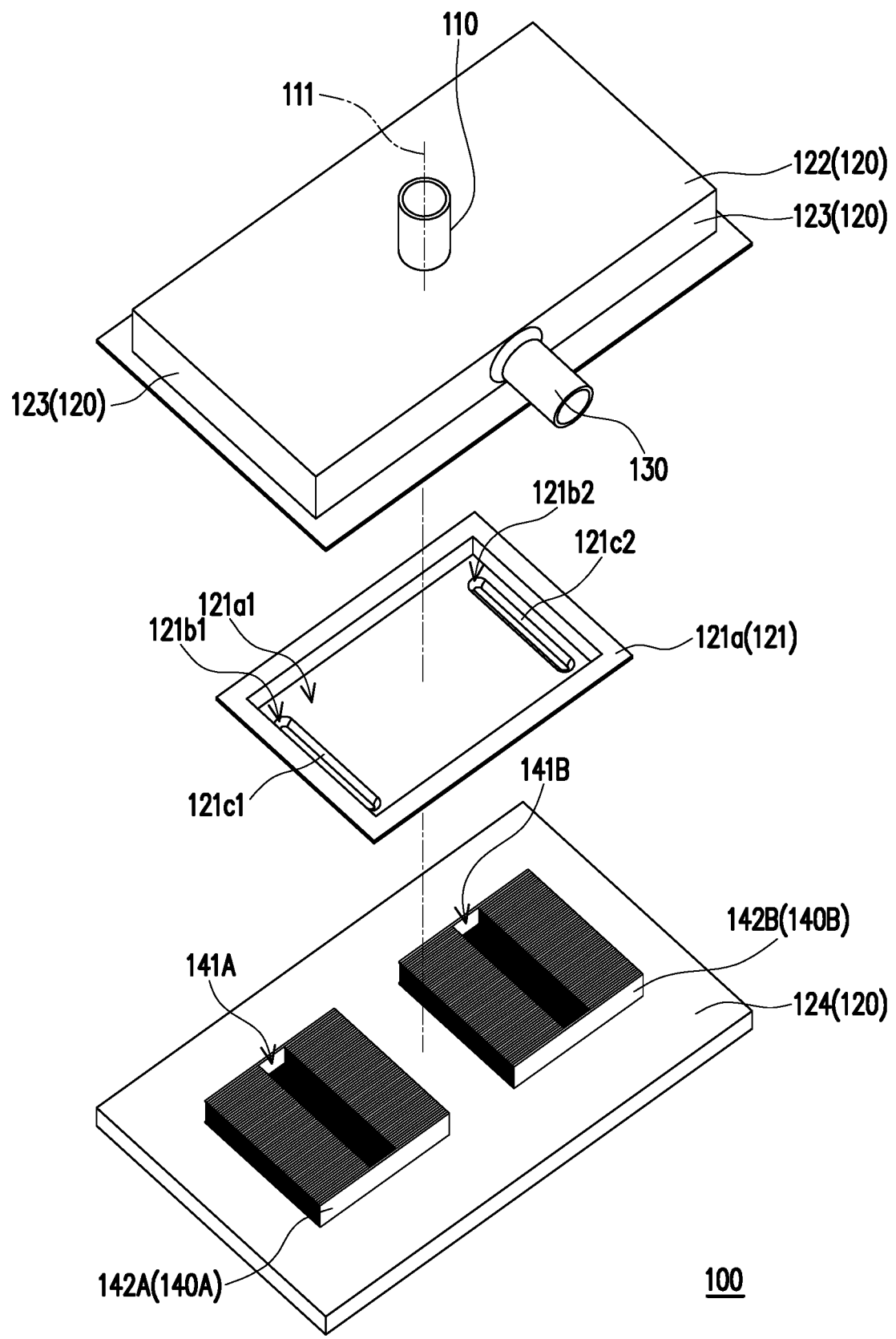
FIG. 2C is a schematic exploded diagram illustrating the heat dissipation module depicted in FIG. 2A.
Figure 2D:
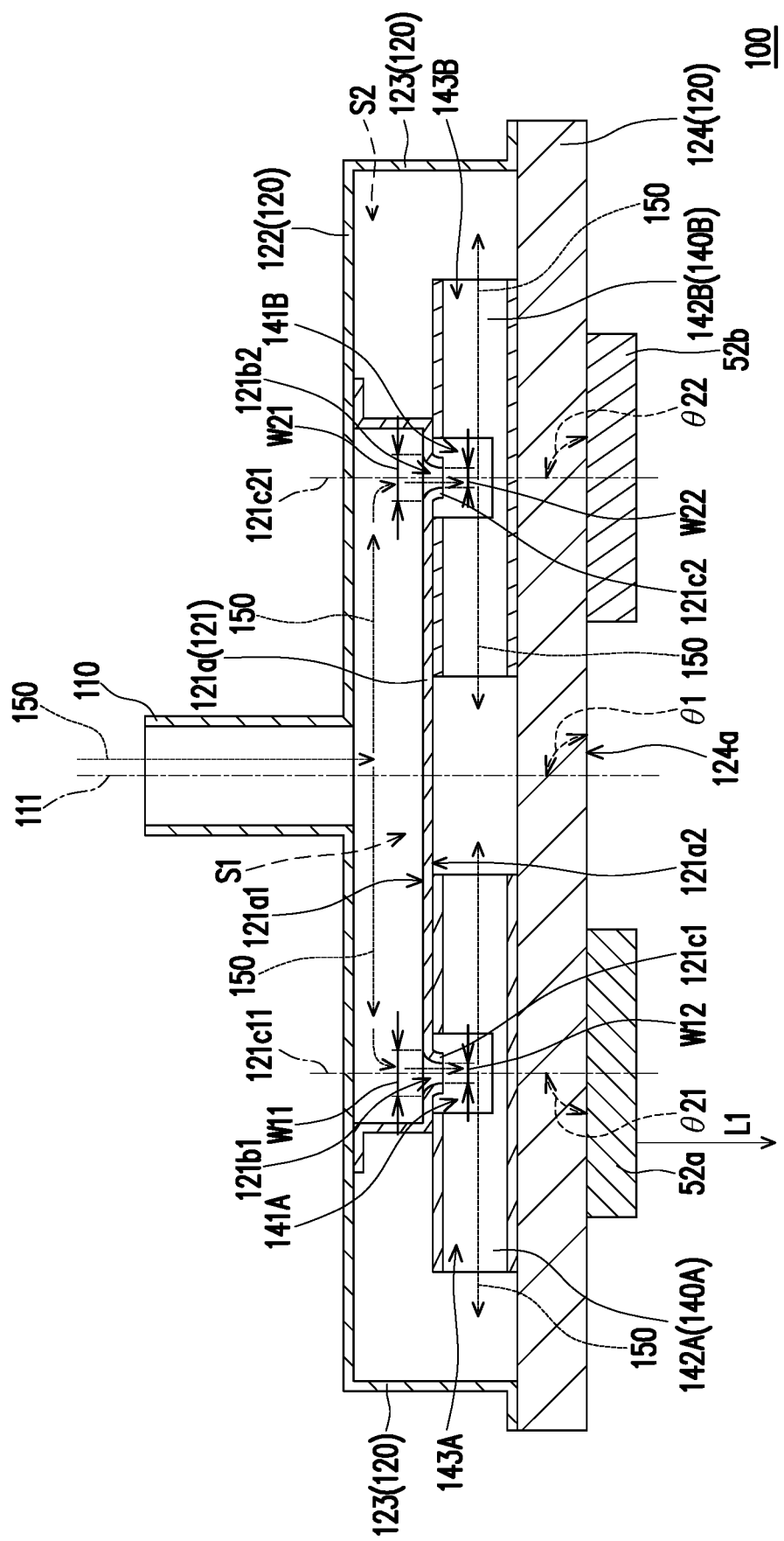
FIG. 2D is a schematic cross-sectional diagram taken along line A-A of FIG. 2A.

FIG. 2A is a schematic stereoscopic diagram illustrating a heat dissipation module according to an embodiment of the invention. FIG. 2B is a schematic perspective diagram illustrating the heat dissipation module depicted in FIG. 2A. FIG. 2C is a schematic exploded diagram illustrating the heat dissipation module depicted in FIG. 2A. FIG. 2D is a schematic cross-sectional diagram taken along line A-A of FIG. 2A. For clear illustration and descriptive convenience, a part of a housing 120 is shown in dashed lines in FIG. 2B to exhibit the internal structure covered by the housing 120. Referring to FIG. 2A, FIG. 2B, FIG. 2C and FIG. 2D, the heat dissipation module 100 of the present embodiment includes a housing 120, at least one inlet (for example, but not limited to, an inlet 110), at least one outlet (for example, but not limited to, an outlet 130) and at least one heat dissipation set (for example, but not limited to, a heat dissipation set 140A and a heat dissipation set 140B). Both the inlet 110 and the outlet 130 are connected to the housing 120. The housing 120 comprises a partition 121. The partition 121 divides the housing 120 to form a first accommodation space S1 and a second accommodation space S2 inside the housing 120. The inlet 110 communicates with the first accommodation space S1. The partition 121 comprises at least one opening (for example, but not limited to, an opening 121b1 and an opening 121b2) disposed therein. The opening 121b1 penetrates through the partition 121 and communicates between the first accommodation space S1 and the second accommodation space S2. The opening 121b2 penetrates through the partition 121 and communicates between the first accommodation space S1 and the second accommodation space S2. The second accommodation space S2 communicates with the outlet 130. Both the heat dissipation sets 140A and 140B are located in the second accommodation space S2. Thus, the heat accumulated at the heat dissipation sets 140A and 140B may be effectively absorbed by a liquid and exhausted out, and the temperature of a heat source (for example, but not limited to the light source module 52 illustrated in FIG. 1) with a high heat-density may be effectively reduced.

Referring to FIG. 2B, FIG. 2C and FIG. 2D, the housing 120 of the present embodiment includes a top plate 122, a plurality of side plates 123 and a bottom plate 124. The side plates 123 surround and are connected with each other. Each of the side plates 123 is connected to the top plate 122, and each of the side plates 123 is connected to the bottom plate 124. Namely, the bottom plate 124 and the top plate 122 are located at two opposite sides of the side plates 123. The inlet 110 is connected onto the top plate 122 along an inlet axis 111. The outlet 130 is connected to one of the side plates 123.

Referring to FIG. 1 and FIG. 2D, a first included angle θ1 is formed between the inlet axis 111 and a bottom surface 124a of the bottom plate 124 in the present embodiment. The first included angle θ1 is, but not limited to, between 45 degrees and 90 degrees. In the present embodiment, the first included angle θ1 is, for example, 90 degrees, and in other words, the inlet axis 111 is perpendicular to the bottom surface 124a of the bottom plate 124. Furthermore, as shown in FIG. 2D, in an embodiment where the bottom surface 124a of the bottom plate 124 contacts the light source module 52 (for example, heat sources 52a and 52b), the inlet axis 111 is parallel to a projection direction of the illumination beam L1. The inlet axis 111 is defined as a center axis of a tube of the inlet 110, and is also a direction along which the liquid flows.

In the embodiment illustrated in FIG. 1, for the purpose of illustration, the first included angle θ1 is marked above the inlet axis 111, but this is not intended to limit the position of the first included angle θ1. For example, viewing from the view angle of FIG. 1, the inlet axis 111 divides the bottom surface 124a of the housing 120 into an upper portion and a lower portion. The first included angle may also refer to an included angle between the bottom surface 124a at the lower portion and the inlet axis 111. Specifically, the first included angle θ1 may be formed between the inlet axis 111 and the bottom surface 124a of the housing 120 upward or downward. In the same way, referring to FIG. 2A, in other embodiments, the inlet axis 111 may also be inclined toward or far away from the outlet.

Referring to FIG. 2C, the partition 121 of the present embodiment may be in groove-shaped, and the groove-shaped partition 121 is connected to the top plate 122, as illustrated in FIG. 2D, and located between the top plate 122 and the bottom plate 124. The heat dissipation sets 140A and 140B are located between the partition 121 and the bottom plate 124. The first accommodation space S1 is, for example, a space jointly surrounded by the groove-shaped partition 121 and part of the top plate 122. The second accommodation space S2 is, for example, a space jointly surrounded by the groove-shaped partition 121, the bottom plate 124, the side plates 123 and other part of the top plate 122.

In other embodiments not shown, the partition may be, for example, plate-shaped, and the plate-shaped partition is connected to the side plates, so as to divide the housing to form the first accommodation space and the second accommodation space inside the housing. The shape of the partition is not limited herein and may be determined based on demands.

To be detailed, referring to FIG. 2B, FIG. 2C and FIG. 2D, the partition 121 of the present embodiment includes a slot 121a, openings 121b1 and 121b2 and at least one nozzle (for example, but limited to a nozzle 121c1 and a nozzle 121c2). The slot 121a comprises a first side 121a1 and a second side 121a2 opposite to each other. The first side 121a1 is located between the top plate 122 and the second side 121a2, and the first side 121a1 is adjacent to the first accommodation space S1. The second side 121a2 is located between the first side 121a1 and the bottom plate 124, and the second side 121a2 is adjacent to the second accommodation space S2. The openings 121b1 and 121b2 penetrate through the first side 121a1 and the second side 121a2 of the slot 121a. The nozzles 121c1 and 121c2 protrude from (i.e., are protrudingly disposed on) the second side 121a2 of the slot 121a. The nozzle 121c1 is disposed at the opening 121b1 of the slot 121a, and the nozzle 121c2 is disposed at the opening 121b2 of the slot 121a. That is, a cooling fluid 150 flows from the first accommodation space S1 through the openings 121b1 and 121b2 and flows into the heat dissipation sets 140A and 140B through the nozzles (i.e., the nozzles 121c1 and 121c2).

In the present embodiment, a first width W11 of the opening 121b1 adjacent to the first side 121a1 is greater than a second width W12 of the opening 121b1 adjacent to the second side 121a2, i.e., W11>W12. A first width W21 of the opening 121b2 adjacent to the first side 121a1 is greater than a second width W22 of the opening 121b2 adjacent to the second side 121a2, i.e., W21>W22. Other embodiments not shown are not limited thereto.

Figure 3:
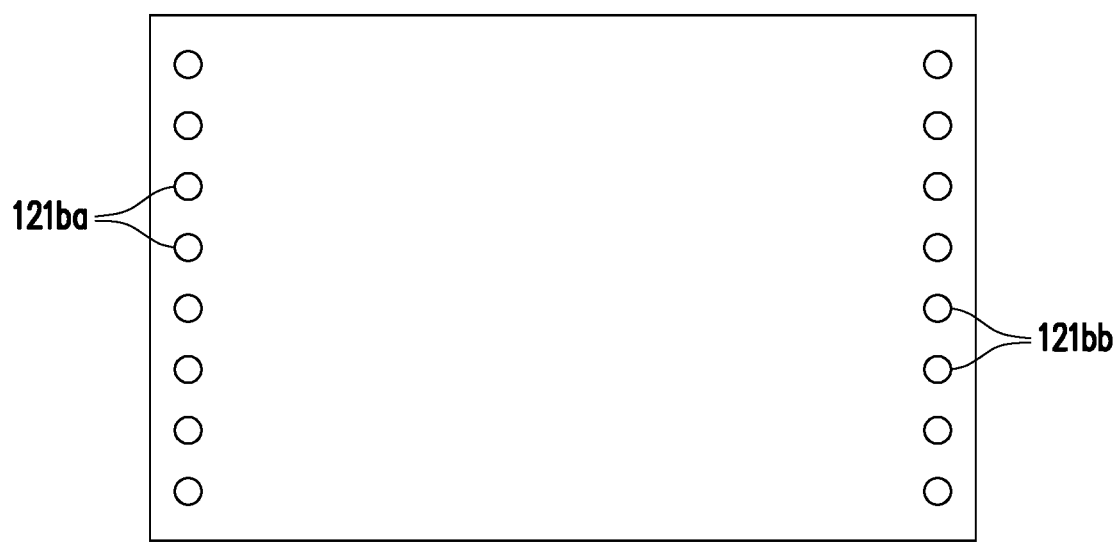
FIG. 3 is a schematic diagram illustrating a partition of a heat dissipation module according to another embodiment of the invention.

In the present embodiment, each of the openings 121b1 and 121b2 may be slit-shaped. Other embodiments not shown are not limited thereto. The shape of each of the openings 121b1 and 121b2 may be designed according to a temperature of the heat source contacted with the heat dissipation module 100 and according to a pressure drop (a drop of a liquid pressure) in the heat dissipation module 100. For example, FIG. 3 is a schematic diagram illustrating a partition of a heat dissipation module according to another embodiment of the invention. Each of openings 121ba and 121bb of the embodiment illustrated in FIG. 3 is circular-shaped, and in order to be adapted to grooves 141A and 141B of the heat dissipation sets 140A and 140B illustrated in FIG. 2C (which will be described in detail below), the circular openings 121ba and 121bb may be distributed in a linear arrangement. In such an arrangement, and the pressure drop may be increased and the heat dissipation effect may be improved. In addition, the shape and size of each of the openings 121ba and 121bb as well as a spacing therebetween may be adaptively adjusted based on actual demands.

As shown in FIG. 2D, the nozzle 121c1 of the present embodiment extends along a nozzle axis 121c11, and a second included angle θ21 is formed between the nozzle axis 121c11 and the bottom surface 124a of the bottom plate 124 of the housing 120. The nozzle 121c2 of the present embodiment extends along a nozzle axis 121c21, and a second included angle θ22 is formed between the nozzle axis 121c21 and the bottom surface 124a of the bottom plate 124 of the housing 120. The second included angles θ21 and θ22 are between 45 degrees and 90 degrees. In the present embodiment, both the second included angles θ21 and θ22 are, for example, 90 degrees.

In FIG. 2D of the present embodiment, for the purpose of illustration, the second included angle θ21 is marked at the left of the nozzle axis 121c11, and this is not intended to limit the position of the second included angle θ21. For example, viewing from the view angle of FIG. 2D, the second included angle θ21 may be formed between the nozzle axis 121c11 and the bottom surface 124a of the housing 120 in a rightward direction. Similarly, for the purpose of illustration, the second included angle θ22 is marked at the right of the nozzle axis 121c11, and this is not intended to limit the position of the second included angle θ22. For example, viewing from the view angle of FIG. 2D, the second included angle θ21 may be formed between the nozzle axis 121c11 and the bottom surface 124a of the housing 120 in a leftward direction.

Figure 2E:
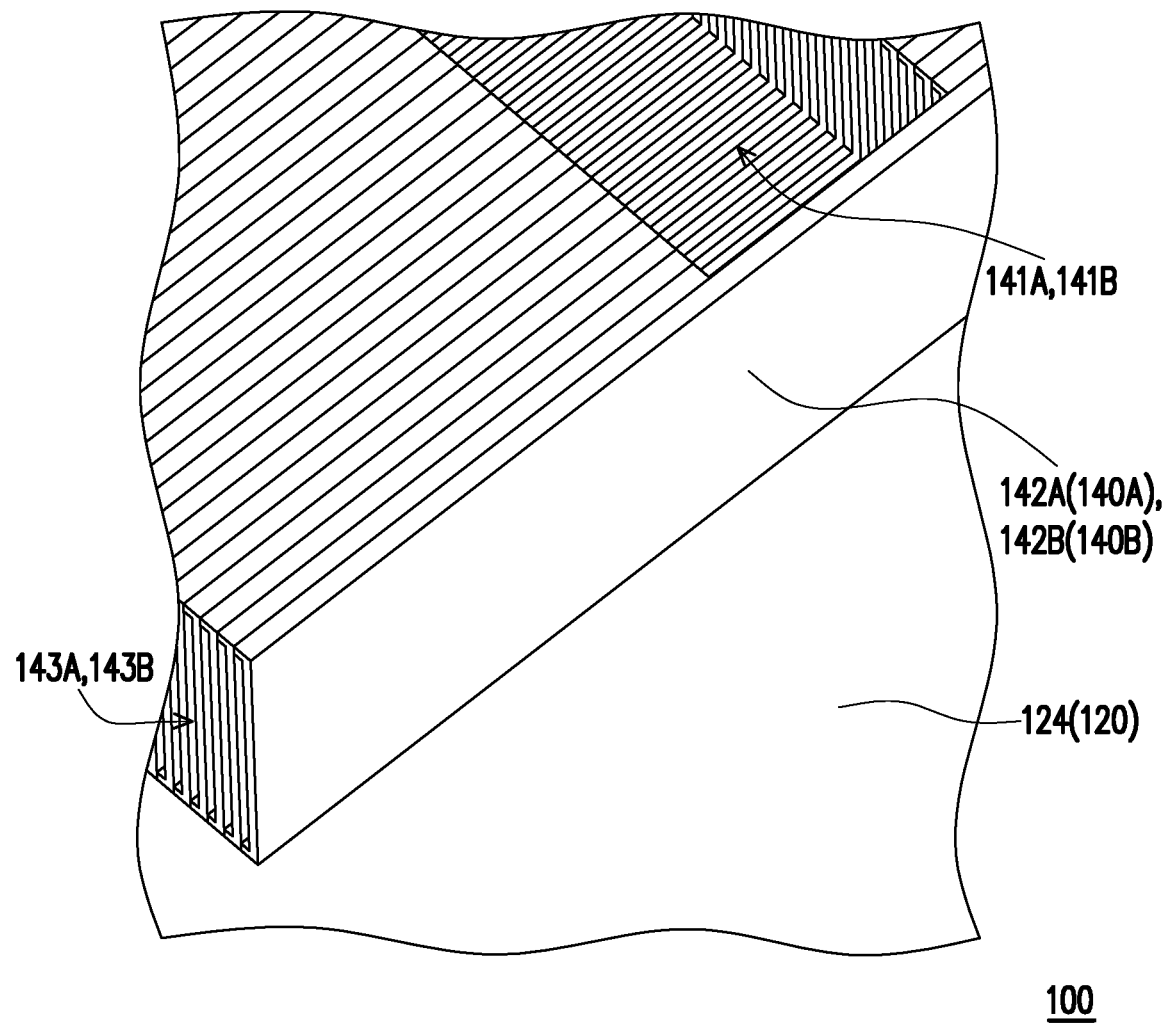
FIG. 2E is a partially enlarged schematic diagram illustrating the heat dissipation set depicted in FIG. 2C.

In the present embodiment, referring to FIG. 2D and FIG. 2E, the heat dissipation set 140A includes a groove 141A, a plurality of heat dissipation fins 142A and a plurality of flow channels 143A. The heat dissipation set 140A is positioned to correspond to the opening 121b1. Specifically, the groove 141A of the heat dissipation set 140A is positioned to be aligned with the opening 121b1 and the nozzle 121c1. The flow channels 143A communicate between the groove 141A and the second accommodation space S2. Similarly, the heat dissipation set 140B includes a groove 141B, a plurality of heat dissipation fins 142B and a plurality of flow channels 143B. The heat dissipation set 140B is positioned to correspond to the opening 121b2. Specifically, the groove 141B of the heat dissipation set 140B is positioned to be aligned with the opening 121b2 and the nozzle 121c2. The flow channels 143B communicate between the groove 141B and the second accommodation space S2. In the present embodiment, the heat dissipation fins 142A and the heat dissipation fins 142B may be sheet-shaped. Other embodiments not shown are not limited thereto. A spacing between each of the heat dissipation fins 142A may be determined according to the temperature of the heat source contacted with the heat dissipation module 100 and according to the pressure drop in the heat dissipation module 100. A spacing between each of the heat dissipation fins 142B may be determined according to the temperature of the heat source contacted with the heat dissipation module 100 and according to the pressure drop in the heat dissipation module 100. For example, the spacing between each of the heat dissipation fins 142A may be shortened to further increase pressure drop and improve the heat dissipation, and the spacing between each of the heat dissipation fins 142B may be shortened to further increase pressure drop and improve the heat dissipation.

Figure 4A:
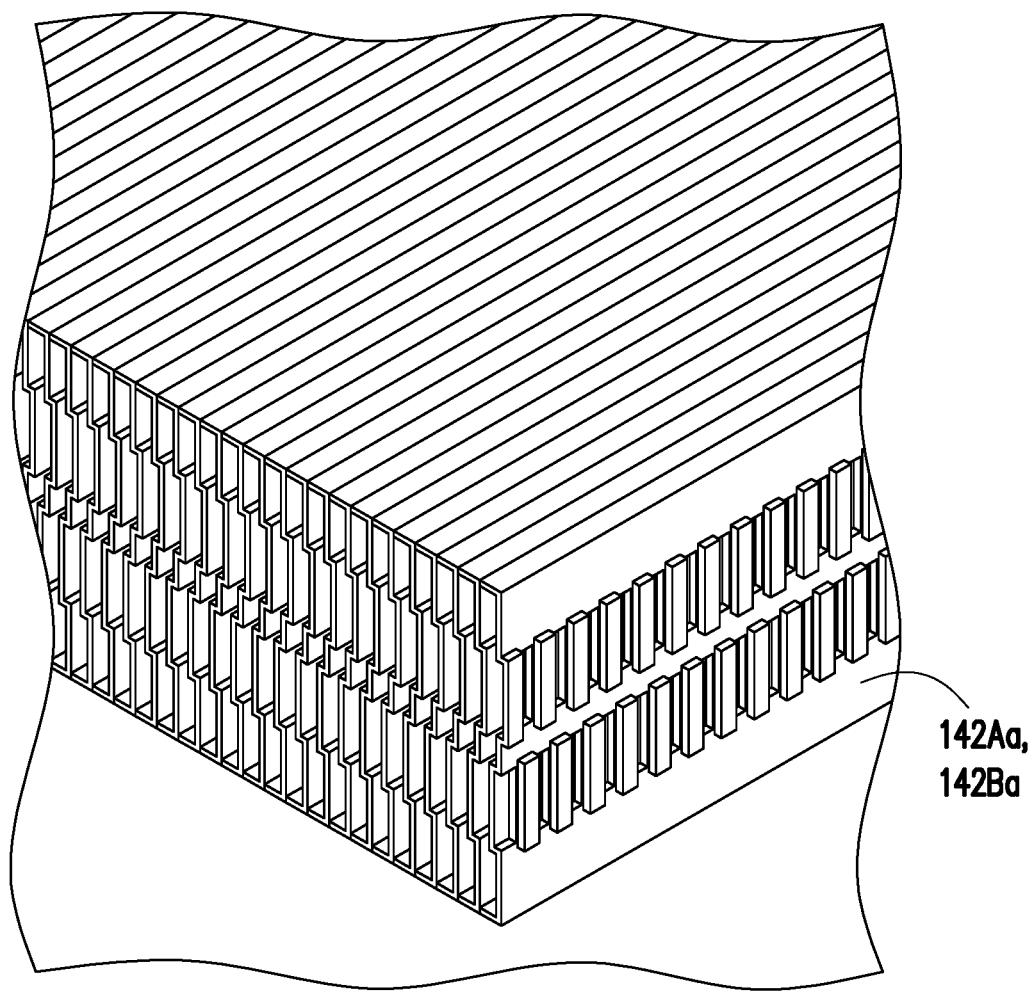
FIG. 4A is a schematic diagram illustrating heat dissipation sets of a heat dissipation module according to another embodiment of the invention.
Figure 4B:
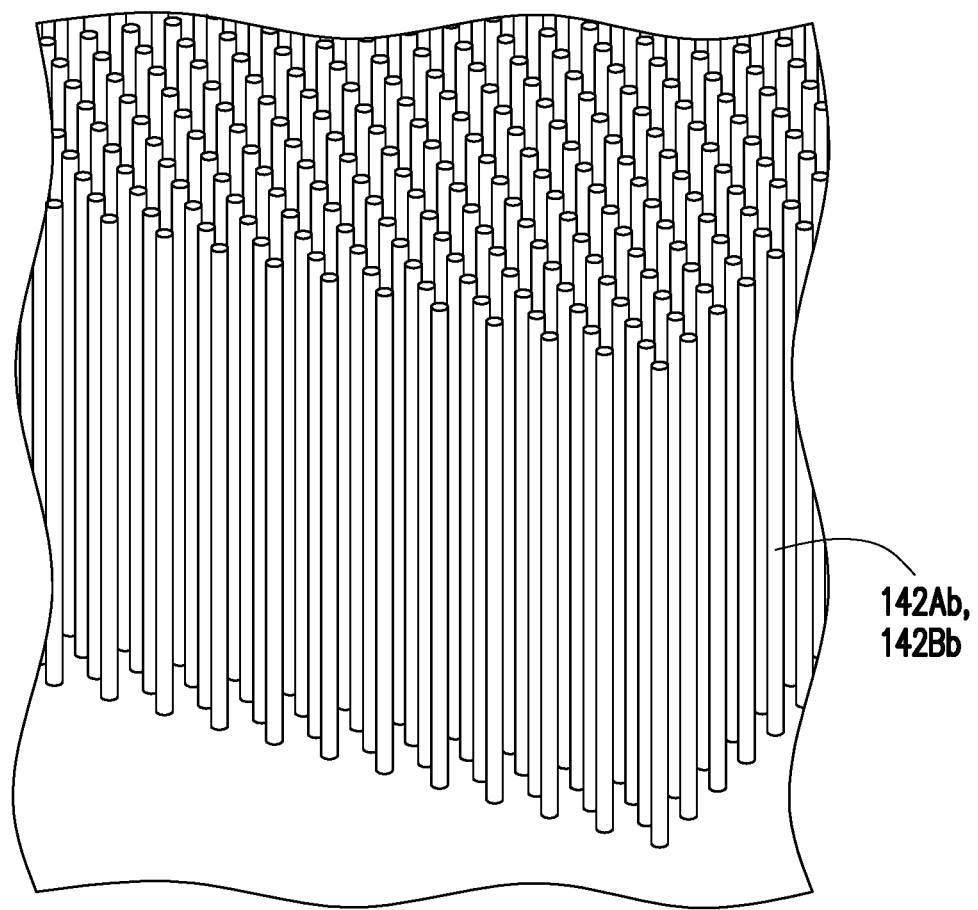
FIG. 4B is a schematic diagram illustrating heat dissipation sets of a heat dissipation module according to yet another embodiment of the invention.
Figure 4C:
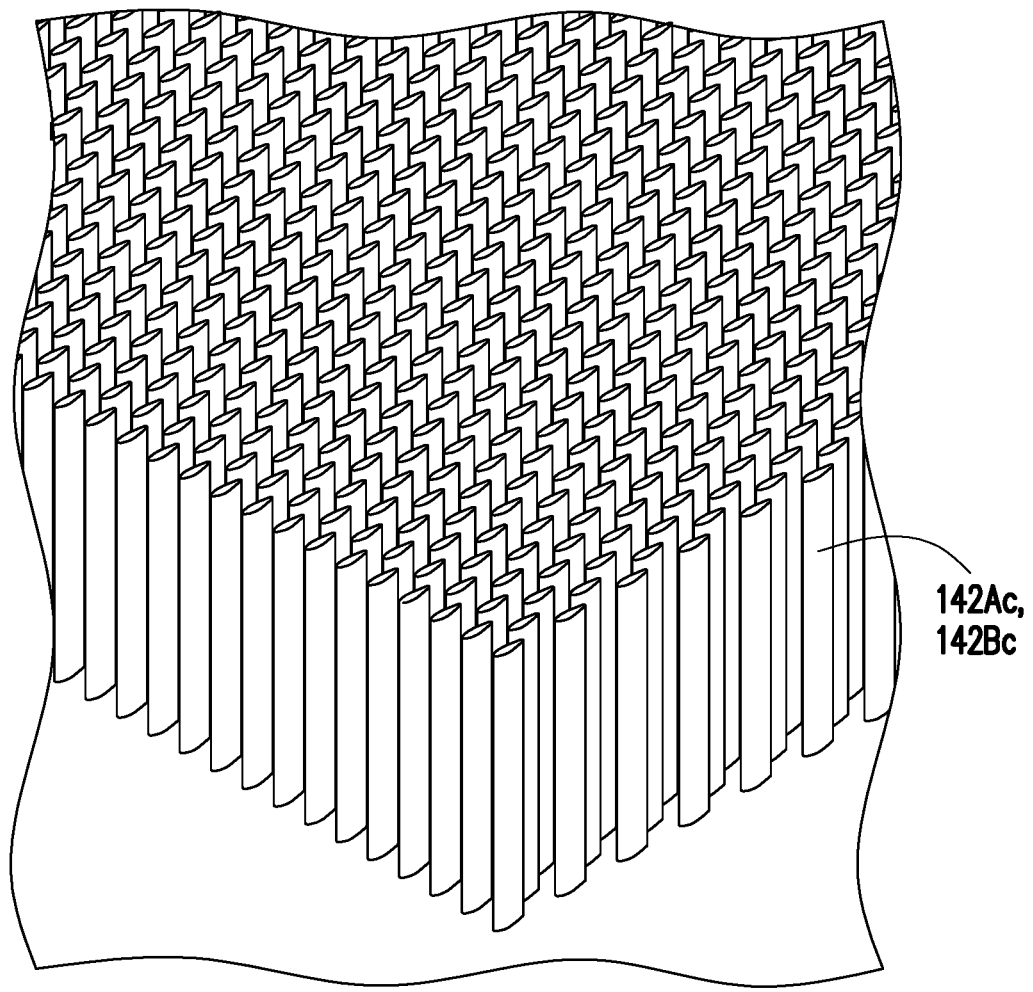
FIG. 4C is a schematic diagram illustrating heat dissipation sets of a heat dissipation module according to still another embodiment of the invention.

For example, FIG. 4A is a schematic diagram illustrating heat dissipation sets of a heat dissipation module according to another embodiment of the invention. Each of heat dissipation fins 142Aa and 142Ba illustrated in FIG. 4A is sheet-shaped with a feature structure on a surface thereof. FIG. 4B is a schematic diagram illustrating heat dissipation sets of a heat dissipation module according to yet another embodiment of the invention. Each of heat dissipation fins 142Ab and 142Bb illustrated in FIG. 4B is columnar-shaped with a circular section. FIG. 4C is a schematic diagram illustrating heat dissipation sets of a heat dissipation module according to still another embodiment of the invention. Each of heat dissipation fins 142Ac and 142Bc illustrated in FIG. 4C is columnar-shaped with a water-drop shaped section.

The structures of the projection apparatus 50 and the heat dissipation module 100 of the invention have been described above, and a principle of heat dissipation of the heat dissipation module 100 of the invention will be described below.

Referring to FIG. 2A, FIG. 2B, and FIG. 2D, the heat dissipation module 100 may be internally filled with a cooling fluid 150. The cooling fluid 150 includes a cooling liquid, and the cooling liquid includes a liquid added with an antifreeze, such as ethylene glycol, propylene glycol, etc. In other embodiments, the cooling fluid 150 may be water. The cooling fluid 150 flows from the inlet 110 into the first accommodation space S1. Taking the present embodiment for example, the cooling fluid 150 is split in the first accommodation space S1, such that the cooling fluid 150 flows sequentially through the opening 121b1, the nozzle 121c1, the groove 141A, the flow channel 143A, the second accommodation space S2 and to the outlet 130, and the cooling fluid 150 also flows sequentially through the opening 121b2, the nozzle 121c2, the groove 141B, the flow channel 143B, the second accommodation space S2 and to the The housing 120 may contact the heat source 52a and the heat source 52b. Specifically, the bottom plate 124 of the housing 120 may contact the heat source 52a and the heat source 52b. In the heat dissipation module 100 of the present embodiment, those contacted with the bottom plate 124 may be the light source module 52 or the light valve 54. Alternatively, the bottom plate 124 of the heat dissipation module 100 may contact both the light source module and the light valve. In other words, both the heat source 52a and the heat source 52b may be light source modules, or both of them are light valves. Alternatively, one of the heat sources 52a and 52b may be a light source module while the other may be a light valve. Certainly, two sets of heat dissipation modules 100 may be used to dissipate heat for the light source module 52 and the light valve 54 respectively. The number and positions of the heat dissipation modules 100 are not limited in the present embodiment.

In the present embodiment, the heat dissipation set 140A is aligned with the heat source 52a in position, such that the heat of the heat source 52a may be effectively transmitted to the heat dissipation fins 142A of the heat dissipation set 140A. The heat dissipation set 140B is aligned with the heat source 52b in position, such that the heat of the heat source 52b may be effectively transmitted to the heat dissipation fins 142B of the heat dissipation set 140B.

The cooling fluid 150, when flowing through the openings 121b1 and 121b2, is in a low-temperature state. When the cooling fluid 150 sequentially flows from the opening 121b1 into the groove 141A and the flow channel 143A, the cooling fluid 150 entering the groove 141A and the flow channel 143A may take away the heat from the heat dissipation set 140A. Then, the cooling fluid 150 exits the flow channel 143A, flows from the second accommodation space S2 to the outlet 130, and may return to the inlet 110 after being cooled down. Similarly, when the cooling fluid 150 sequentially flows from the opening 121b2 into the groove 141B and the flow channel 143B, the cooling fluid 150 entering the groove 141B and the flow channel 143B may take away the heat from the heat dissipation set 140B. Then, the cooling fluid 150 exits the flow channel 143B, flows from the second accommodation space S2 to the outlet 130, and may return to the inlet 110 after being cooled down. In other words, a temperature of the cooling fluid 150 flowing through the openings 121b1 and 121b2 is lower than a temperature of the cooling fluid 150 flowing through the heat dissipation sets 140A and 140B.

States of the cooling fluid 150 in the heat dissipation module 100 is not such limited. For example, the cooling fluid 150, when flowing through the inlet 110, the first accommodation space S1, the openings 121b1 and 121b2, the grooves 141A and 141B, the flow channels 143A and 143B, the second accommodation space S2 and the outlet 130, may be in a liquid state. Alternatively, the cooling fluid 150 may be in a liquid state when flowing through the inlet 110, the first accommodation space S1 and the openings 121b1 and 121b2, and then may be gradually boiled when entering the grooves 141A and 141B and the flow channels 143A and 143B such that the cooling fluid 150 may be in both a liquid state and a gas state. The cooling fluid 150 may be transferred into a gas when entering the second accommodation space S2 and the outlet 130. The aspects of the cooling fluid 150 in the heat dissipation module 100 may be determined based on demands.

In the heat dissipation module 100 of the present embodiment, the slot 121a comprises the openings 121b1 and 121b2 to effectively distribute the low-temperature cooling fluid, such that the low-temperature cooling fluid 150 may directly impact onto the heat dissipation sets 140A and 140B, so as to cool down the heat sources 52a and 52b. In the present embodiment, it may be ensured that the cooling fluid 150 entering the groove 141A and the groove 141B is of a lower temperature, such that more heat may be taken away from the heat dissipation sets 140A and 140B. Therefore, the temperatures of the heat sources 52a and 52b may be effectively reduced.

In addition, the recessing design of the grooves 141A and the groove 141B may facilitate reducing the pressure drop when the cooling fluid 150 enters the heat dissipation sets 140A and 140B, and may be used to effectively distribute the cooling fluid 150 towards the flow channels 143A and 143B respectively.

Figure 5A:
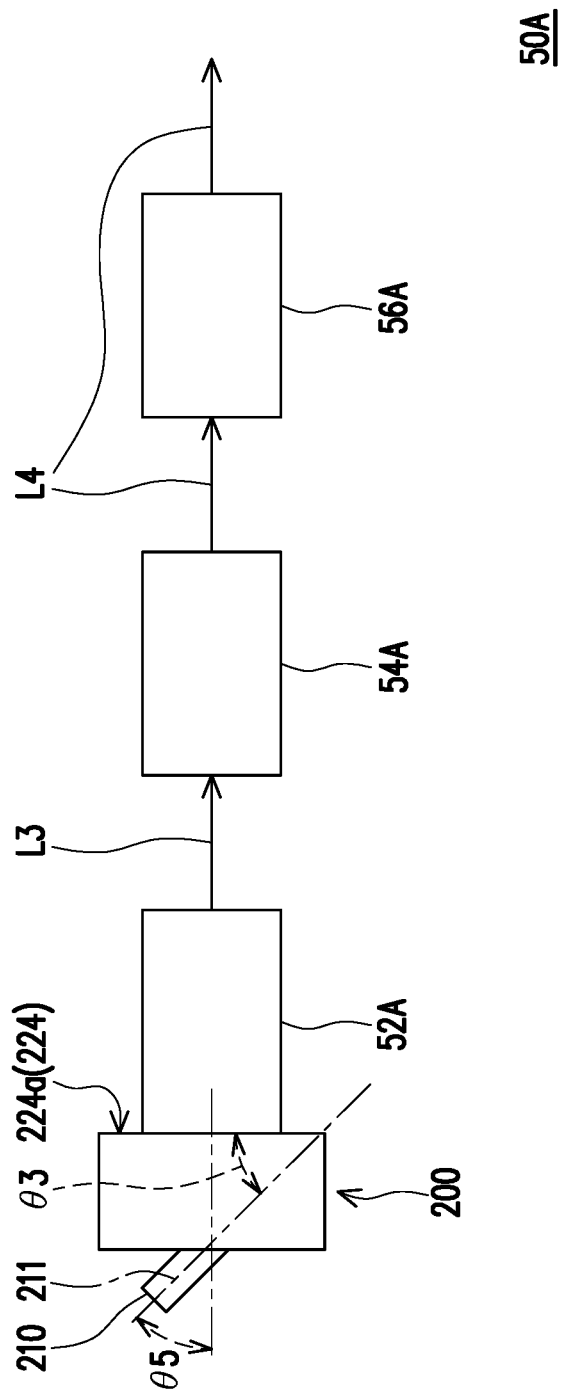
FIG. 5A is a schematic diagram illustrating a projection apparatus according to another embodiment of the invention.
Figure 5B:
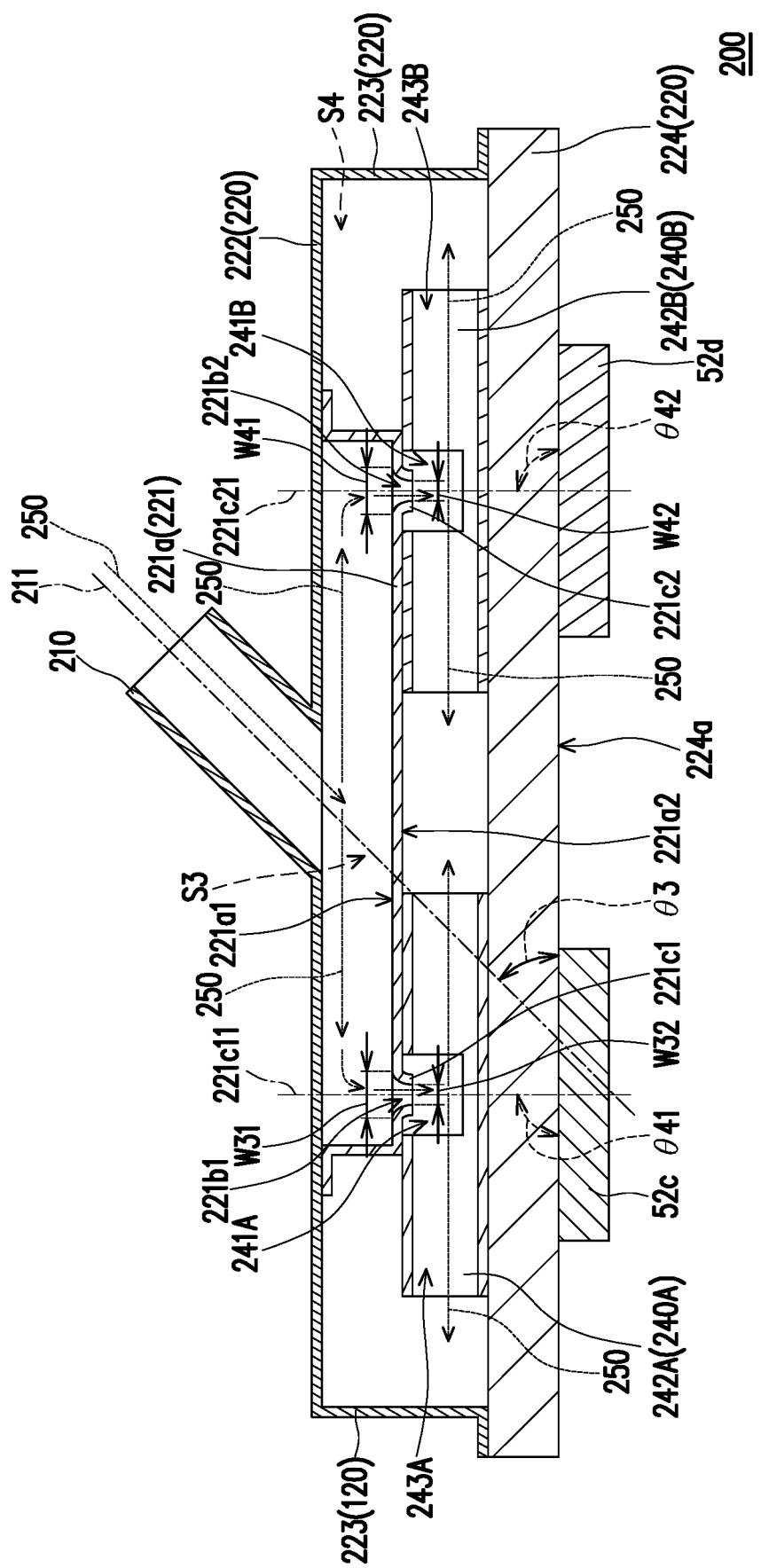
FIG. 5B is a schematic diagram illustrating a heat dissipation module according to another embodiment of the invention.

FIG. 5A is a schematic diagram illustrating a projection apparatus according to another embodiment of the invention. FIG. 5B is a schematic diagram illustrating a heat dissipation module according to another embodiment of the invention. A projection apparatus 50A and a heat dissipation module 200 of the embodiments illustrated in FIG. 5A and FIG. 5B are similar to the projection apparatus 50 and the heat dissipation module 100 of the embodiments illustrated in FIG. 1 and FIG. 2D. The difference therebetween lies in that: a first included angle θ3 is formed between an inlet axis 211 and a bottom surface 224a of a bottom plate 224 in the present embodiment, and the first included angle θ3 is between 45 degrees and 90 degrees. The first included angle θ3 may be, for example, 45 degrees. In other words, a third included angle θ5 is formed between the inlet axis 211 and a projection direction of an illumination beam L3 generated by a light source module 52A, and the third included angle θ5 is less than or equal to 45 degrees.

Based on the above, the embodiments of the invention achieve at least one of the following advantages or effects. The partition divides the housing to form the first accommodation space and the second accommodation space inside the housing, and the at least one heat dissipation set is located in the second accommodation space. The at least one inlet communicates with the first accommodation space, the at least one opening penetrates through the partition and communicates the first accommodation space with the second accommodation space, and the second accommodation space communicates with the at least one outlet. In such a configuration, heat accumulated at the heat dissipation set may be effectively transferred out, and the temperature of the heat source with a high heat-density may be effectively reduced.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A heat dissipation module, comprising:
 a housing, comprising a partition, wherein the partition divides the housing to form a first accommodation space and a second accommodation space inside the housing, at least two openings are disposed in the partition, and the at least two openings penetrate through the partition and communicate the first accommodation space with the second accommodation space;
 at least one inlet, connected to the housing and communicating with the first accommodation space;
 at least one outlet, connected to the housing and communicating with the second accommodation space; and
 at least two heat dissipation sets, located in the second accommodation space, wherein the at least two heat dissipation sets respectively include at least one groove, and the at least two openings are individually aligned with the at least one groove.

2. The heat dissipation module according to claim 1, further comprising:
 a cooling fluid, sequentially flowing through the at least one inlet, the first accommodation space, the at least two openings, the at least two heat dissipation sets, the second accommodation space and the at least one outlet.

3. The heat dissipation module according to claim 2, wherein a temperature of the cooling fluid flowing through the at least two openings is lower than a temperature of the cooling fluid flowing through the at least two heat dissipation sets.

4. The heat dissipation module according to claim wherein the cooling fluid flowing through the at least one inlet, the first accommodation space and the at least two openings comprises a liquid fluid, the cooling fluid flowing through the at least two heat dissipation sets comprises a liquid fluid and a gas fluid, and the cooling fluid flowing through the second accommodation space and the at least one outlet comprises a gas fluid.

5. The heat dissipation module according to claim 1, wherein the housing contacts at least one heat source, and the at least two heat dissipation sets inside the housing is aligned with the at least one heat source.

6. The heat dissipation module according to claim 1, wherein the housing further comprises:
   a top plate, the at least one inlet being connected onto the top plate along an inlet axis;
   a plurality of side plates, respectively connected to the top plate, and the at least one outlet being connected to one of the plurality of side plates; and
   a bottom plate, connected with the plurality of side plates, wherein the bottom plate and the top plate are located at two opposite sides of the plurality of side plates, the partition is located between the top plate and the bottom plate, and a first included angle is formed between the inlet axis and a bottom surface of the bottom plate.

7. The heat dissipation module according to claim 6, wherein the first included angle is between 45 degrees and 90 degrees.

8. The heat dissipation module according to claim 6, wherein the bottom plate of the housing contacts at least one heat source, and the at least two heat dissipation sets are aligned with the at least one heat source.

9. The heat dissipation module according to claim 1, wherein at least one nozzle is protrudingly disposed on the partition, and the at least one nozzle is disposed at the at least two openings of the partition.

10. The heat dissipation module according to claim 9, wherein the at least one nozzle extends along a nozzle axis, and a second included angle is formed between the nozzle axis and a bottom surface of the housing, wherein the second included angle is between 45 degrees and 90 degrees.

11. The heat dissipation module according to claim 1, wherein each of the at least two openings has a width adjacent to the first accommodation space and a width adjacent to the second accommodation space, and the width adjacent to the first accommodation space is greater than the width adjacent to the second accommodation space.

12. The heat dissipation module according to claim 1, wherein the at least two openings are circular-shaped or slit-shaped.

13. The heat dissipation module according to claim 1, wherein the at least two heat dissipation sets comprise a plurality of heat dissipation fins, and one of the plurality of heat dissipation fins is sheet-shaped, columnar-shaped or sheet-shaped with a feature structure there.

14. A projection apparatus, comprising:
   a light source module, configured to provide an illumination beam;
   a light valve, configured to convert the illuminating beam into an image beam;
   a projection lens, configured to project the image light beam; and
   a heat dissipation module, comprising:
      a housing, comprising a partition, wherein the partition divides the housing to form a first accommodation space and a second accommodation space inside the housing, at least two openings are disposed in the partition, and the at least two openings penetrate through the partition and communicate the first accommodation space with the second accommodation space;
      at least one inlet, connected to the housing and communicating with the first accommodation space;
      at least one outlet, connected to the housing and communicating with the second accommodation space; and
      at least two heat dissipation sets, located in the second accommodation space, wherein the at least two heat dissipation sets respectively include at least one groove, and the at least two openings are individually aligned with the at least one groove.

15. The projection apparatus according to claim 14, wherein the housing further comprises:
   a top plate, the at least one inlet being connected onto the top plate along an inlet axis;
   a plurality of side plates, respectively connected to the top plate, and the at least one outlet being connected to one of the plurality of side plates; and
   a bottom plate, connected with the plurality of side plates, wherein the bottom plate and the top plate are located at two opposite sides of the plurality of side plates, the partition is located between the top plate and the bottom plate, and a first included angle is formed between the inlet axis and a bottom surface of the bottom plate.

16. The projection apparatus according to claim 15, wherein the inlet axis is parallel to a projection direction of the illumination beam generated by the light source module.

17. The projection apparatus according to claim 15, wherein an included angle is formed between the inlet axis and the projection direction of the illumination beam generated by the light source module, and the included angle is less than or equal to 45 degrees.

18. The projection apparatus according to claim 14, wherein at least one nozzle is protrudingly disposed on the partition, and the at least one nozzle is disposed at the at least two openings of the partition.

19. The projection apparatus according to claim 18, wherein the at least one nozzle extends along a nozzle axis, and a second included angle is formed between the nozzle axis and a bottom surface of the housing, wherein the second included angle is between 45 degrees and 90 degrees.

* * * * *